United States Patent
Fukarek et al.

(10) Patent No.: US 12,392,024 B2
(45) Date of Patent: Aug. 19, 2025

(54) ANODE FOR PVD PROCESSES

(71) Applicant: VTD VAKUUMTECHNIK DRESDEN GMBH, Dresden (DE)

(72) Inventors: Wolfgang Fukarek, Dresden (DE); Martin Holzherr, Dresden (DE)

(73) Assignee: VTD VAKUUMTECHNIK DRESDEN GMBH, Dresden (DE)

( * ) Notice: Subject to any disclaimer, the term of this patent is extended or adjusted under 35 U.S.C. 154(b) by 828 days.

(21) Appl. No.: 17/606,199

(22) PCT Filed: Apr. 7, 2020

(86) PCT No.: PCT/DE2020/200024
§ 371 (c)(1),
(2) Date: Oct. 25, 2021

(87) PCT Pub. No.: WO2020/216419
PCT Pub. Date: Oct. 29, 2020

(65) Prior Publication Data
US 2022/0205079 A1    Jun. 30, 2022

(30) Foreign Application Priority Data
Apr. 25, 2019   (DE) .................. 10 2019 110 642.7

(51) Int. Cl.
*H01J 37/32* (2006.01)
*C23C 14/32* (2006.01)

(52) U.S. Cl.
CPC ........ *C23C 14/325* (2013.01); *H01J 37/3255* (2013.01); *H01J 37/32559* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 4,478,700 A | * | 10/1984 | Criss ............... C23C 14/34 204/192.15 |
| 2007/0193518 A1 | * | 8/2007 | Shiina ............ H05H 1/50 118/723 R |

(Continued)

FOREIGN PATENT DOCUMENTS

| | | |
|---|---|---|
| DE | 2503374 A1 | 8/1976 |
| DE | 3413891 A1 | 10/1985 |

(Continued)

OTHER PUBLICATIONS

Office Action mailed Feb. 27, 2020 issued in corresponding German Patent Application No. 102019110642.7, filed Apr. 25, 2019.

(Continued)

*Primary Examiner* — Jason Berman
(74) *Attorney, Agent, or Firm* — Viering, Jentschura & Partner mbB

(57) ABSTRACT

The invention relates to the proposal of an electrode arrangement in a device for carrying out processes of physical vapor deposition that greatly reduces or even prevents the degradation of the electrode material caused by accretions. The contamination of the anode occurring in these processes due to cathodic carbon is minimized or prevented by the application of a thin adhesion-reducing coating of high electrical conductivity to the anode, which coating has poorer adhesive properties with regard to the coating material than the uncoated anode material. This coating is preferably a nitride coating, particularly preferably of TiN, applied with a coating thickness of between 0.1 μm and 3.5 μm.

13 Claims, 2 Drawing Sheets

(56) References Cited

U.S. PATENT DOCUMENTS

Figure 1:
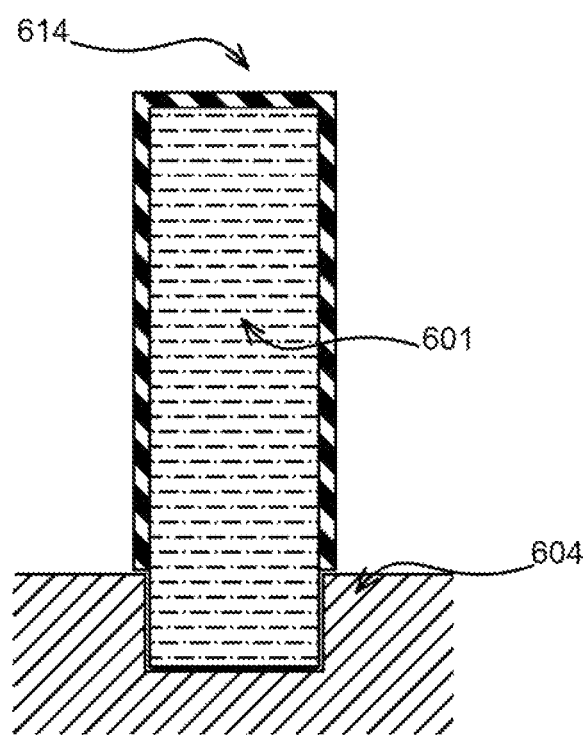

| | | | | |
|---|---|---|---|---|
| 2008/0292812 A1 | 11/2008 | Ramm et al. | | |
| 2012/0012466 A1* | 1/2012 | Sperry | ............... | C02F 1/4674 |
| | | | | 204/252 |
| 2012/0298139 A1* | 11/2012 | Naff | ............... | B24C 1/04 |
| | | | | 134/37 |

FOREIGN PATENT DOCUMENTS

| | | |
|---|---|---|
| DE | 4228499 C1 | 10/1993 |
| DE | 69706850 T2 | 5/2002 |
| DE | 102013103762 A1 | 10/2014 |
| EP | 0904426 A1 | 3/1999 |
| EP | 3196331 A1 | 7/2017 |
| JP | 2005267909 A | 9/2005 |
| JP | 2010528179 A | 8/2010 |
| JP | 2013065417 A | 4/2013 |
| JP | 2013518177 A | 5/2013 |
| JP | 2014173129 A | 9/2014 |
| WO | 2013091802 A1 | 6/2013 |

OTHER PUBLICATIONS

International Search Report mailed issued in corresponding PCT Application No. PCT/DE2020/200024, Filed Apr. 7, 2020.
Notice of Reasons for Refusal issued for the Japanese Patent Application No. 2021563673, dated Feb. 21, 2023, 4 pages (for informational purposes only).
Search Report by Registered Search Organization issued for the Japanese Patent Application No. 2021563673, dated Jan. 26, 2023, 13 pages (for informational purposes only).
Schintlmeister, W. et al., "Titankarid und -nitrid für hochverschleissfeste und dekorative Schichten", Metallwissenschaft und Technik, Jul. 1974, 12 pages (including 6 pages English translation).
Wikipedia; "Titanium aluminium nitride"; https://en.wikipedia.org/wiki/Titanium_aluminium_nitride; retrieved on May 15, 2023, 3 pages.
Batko, I. et al., "Electrical Resistivity of CrN Thin Films", 15th Czech and Slovak Conference on Magnetism, Jun. 17-21, 2013, pp. 415-416, vol. 126, No. 1, Acta Physica Polonica A, Košice, Slovakia.

* cited by examiner

ANODE FOR PVD PROCESSES

The invention relates to an anode and an anode arrangement in a device for carrying out processes of physical vapor deposition, a method for producing such an anode and the use of the anode and the device which greatly reduces or even prevents the degradation of the anode caused by accretions.

In the case of a vapor deposition carried out by means of PVD processes, the material used for the coating is first converted into its gas phase by evaporation, sublimation or sputtering and completely or partially ionized by discharge processes. Processes that are suitable for bringing matter into the plasma state are, for example, magnetron discharges or arc discharges.

The freely movable electrical charge carriers required for the arc can be generated in a vacuum by field emission, thermionic emission or targeted ionization of the cathode material. The targeted ionization of the cathode material is often used in this case.

Before the actual coating, it is important to ensure that the best possible adhesion properties for the coating material are created on the substrate. Since nitride coatings, surface oxides and adsorbates such as water and hydrocarbons have proven to be particularly problematic in this regard, it is common practice to remove them before the actual coating process.

WO 201 309 1802 A1 describes a method for surface coating by means of an arc discharge. The problem is that cathode material clusters occasionally become detached from the cathode during the coating process. This problem is addressed here through the use of magnetic fields which vary the point of interaction between the arc discharge and the electrode surface. However, using magnetic fields negatively influences the charged particles by reducing the coating rates.

EP 3 196 331 A1 describes the application of adhesion-reducing coatings to moving substrates by means of a PVD method using a substrate voltage. The substrates are charged in order to minimize losses of the coating material on the inner surfaces of the PVD device that is used.

In PVD processes, the material of an electrode is sputtered or vaporized. The respective electrode is consumed and thus degenerated by the process. This is always accompanied by a material transfer to the associated counter electrode. If the degenerating electrode is the cathode, the problem arises that there is an unwanted accumulation of cathode material on the anode. These accumulations change the geometrical shape of the anode and lead to changes in the distance between the surfaces of the electrodes. This change in the distance has a negative effect on the arc conditions up to the point where the arc is extinguished due to a short circuit between the two electrodes.

Various solutions for avoiding a coating of the anode by deposition processes are known for magnetron discharges. These include the hidden anode and the bipolar discharge.

In the case of the hidden magnetron anode, a magnetic field directs the plasma behind the viewing range of the cathode, as a result of which only charged particles can reach the anode. This is not applicable to arc discharges since the vaporized material is highly ionized and would no longer be available for the coating due to the deflection in strong magnetic fields onto a hidden anode.

In the case of a bipolar discharge, the coating on the anode is removed again in an alternating operation as a cathode. This principle is not applicable to arc discharges either.

Particularly in the case of pulsed carbon high-current arcs in which the anode must be arranged close to the cathode to reliably ignite the discharge, the above-mentioned accumulations represent a major problem.

According to the current prior art, the anodes used are mainly made of steel, copper or titanium core material. The unavoidable accumulations of the graphitic cathode material are removed mechanically, for example, with a scraping, grinding, turning or blasting process. The surface damaged by the mechanical removal of the cathode material is, ideally, treated by subsequent polishing.

The object of the invention is the proposal of an anode and an anode arrangement in a device, their use and the production of such an anode, which greatly reduces or even prevents the degradation of the positively charged electrode caused by accretions.

The object is achieved by the features of the independent claims. Preferred embodiments are disclosed in the dependent claims which refer back to the independent claims.

The anode according to the invention has a shape that is known per se. According to the invention, the degradation is avoided or largely reduced by a complete or partial covering with an adhesion-reducing thin coating of high electrical conductivity (hereinafter referred to as a "thin coating") that is arranged on the surface of the anode.

Thin coatings are understood as flat regions of a substrate that differ structurally and/or materially from adjacent coatings and the substrate on which they are deposited and whose thickness ranges from a few atomic coatings, but at least one mono-coating, up to 10 μm.

One method for the surface modification by coating or for applying a thin coating to a workpiece is the physical vapor deposition or the PVD process. Within the meaning of the present specification, the workpiece is understood to be an object intended for coating and is referred to as a "substrate."

The process of the vacuum arc described below is referred to with the terms "arc discharge," "arc" or "arc-discharge," which are used synonymously within the meaning of this specification. These phenomena are used to generate a plasma. This is mainly done under vacuum conditions.

Within the meaning of this invention, a pumping station is a device for generating and maintaining a vacuum within a closed vessel.

In this specification, electrodes are referred to as an "anode" or a "cathode," depending on the context. The cathode is understood to mean an electrode with an overall negative electrical charge state. Analogously, an electrode with a largely positive electrical charge state is understood as an anode.

Below, a "hot electrode," which is actively heated beforehand and in its operating state until a defined temperature is reached, is understood to mean both an anode and a cathode. The embodiments of the individual electrodes are referred to below as "hot anode" and "hot cathode."

The device according to the invention comprises a vessel which is suitable for enclosing various process pressures, in particular in the vacuum range. At least two electrodes that can be subjected to an electrical voltage from outside the vessel are arranged in the interior of the vessel, wherein at least one of the electrodes functions as an anode and at least one of the electrodes functions as a cathode. An arc discharge is generated between the cathode and the anode and maintained for a defined period of time.

These arc discharges result in material being removed from the cathode and accretions on the anode. It has surprisingly been found that a thin coating of high electrical conductivity that is used according to the invention significantly reduces the adhesive force between the accretions and the surface of the anode(s). Therefore, according to the invention, at least one of the anodes used is characterized in that it comprises an adhesion-reducing and electrically conductive thin coating which completely or partially covers the surface of the anode.

The adhesion-reducing thin coating of high electrical conductivity applied to the anodes has poorer adhesion properties with regard to the coating material than the uncoated electrode material.

The adhesion-reducing thin coating of high electrical conductivity greatly reduces or even prevents the accretions from adhering. At least the removal of these accretions is made significantly easier. It is particularly advantageous if the adhesion-reducing thin coating forms a closed surface in the regions in which it is applied and is not interspersed with pores or other small openings that would facilitate an adhesion of coating material.

What is advantageous about a partial coating of the surface of the electrode is the reduced production cost. In general, the material of the thin coating is applied during a coating process. If a region of the object to be coated is covered before the coating, a shaded area is created which is not available for the coating. In this way, surface regions that do not have a thin-layer coating can be produced in a targeted manner. These regions can advantageously be used to mount the anode.

The uncoated regions of the anode are advantageously arranged during operation in the arc arrangement in such a way that the uncoated regions are covered in order to prevent cathode material from adhering to them.

Another advantage of a complete coating is the simplified assembly effort since, particularly when using anodes with a cylinder-symmetrical cross-section, no special alignment of the anode within the arc arrangement has to be taken into account since the entire surface of the anode offers reduced adhesion for cathode material.

The cathode preferably consists entirely of an electrically conductive carbon modification or comprises, at least on its surface, an electrically conductive carbon modification. The electrically conductive carbon modification is preferably formed entirely or partially from graphite.

Since the cathode is subject to constant wear and the anode has to be subjected to regular cleaning, at least one of the electrodes is movably and/or exchangeably arranged in a preferred embodiment. In this context, "movable" is preferably understood to refer to the properties "rotatable," "pivotable" and/or "displaceable."

The thin coating is preferably selected from a material that is suitable for high anode temperatures since the anode is preferably designed as a "hot anode."

It is advantageous if the thin coating forms a chemical bond with the coating material only with difficulty or at best not at all, i.e., for example, in the case of carbon-based coating material, it is selected from a material which forms a chemical bond with the carbon only with difficulty or at best not at all, for example, carbides only with difficulty or at best not at all. This property contributes significantly to the creation of process-favorable adhesion properties between the coating material and the thin coating.

The thin coating is preferably a coating of metal nitride. The nitride-forming metal is preferably selected from Ti, Zr, Hf, V or mixtures of these metals. Nitrides with more than one metal in the compound are among the preferred embodiments if they have a specific electrical resistance of more than 10 μcm and up to 150 μcm.

In order to create a closed surface with sufficient adhesion between the thin coating and the core material of the anode on the one hand and to avoid a detachment or abrasion of the thin coating on the other hand, a coating thickness of the thin coating of more than 0.1 μm and less than 3.5 μm is preferred, of more than 0.5 μm and less than 3.2 μm is particularly preferred and of 1 μm and less than 3 μm is especially preferred.

The vacuum vessel of the arc arrangement in which the coating processes take place is preferably connected to a pumping station for generating and monitoring a vacuum by means of a vacuum-suitable connection.

In a further embodiment, at least one vacuum-suitable electrical feedthrough is passed through the casing of the vacuum vessel. This feedthrough is suitable for conducting electrical currents and connecting at least one of the electrodes in an electrically conductive manner to a voltage source located outside the vacuum vessel by means of electrical leads.

In a further preferred embodiment, the device for the arc arrangement is characterized in that at least one opening, which can be closed in a gas-tight manner, is provided in the vacuum vessel wall, the opening of which makes it possible for objects to be transferred into and out of the vessel.

A mount for receiving at least one object is arranged in the interior of the vessel, wherein the mount is conductive but insulated from the housing and can be subjected to an electrical voltage from outside the vessel.

In a further preferred embodiment, a mount for receiving at least one substrate is arranged in the interior of the vessel, wherein the holder is designed to be electrically insulated from the substrate and the housing and only the substrate can be subjected to an electrical voltage from outside the vessel.

The use of an anode and a device with the anode according to the invention as described above in a coating system for coating substrates is preferred because it significantly increases the time the device can be operated before the anode must be changed.

It has been found that the thin coating advantageously has a very low roughness. This is due to the reduced adhesion support due to a particularly smooth surface. In addition, there are fewer points of extremely strong current flow on a particularly smooth electrode surface that could adversely affect the electrode surface. In order to achieve a very low roughness of the thin coating, it has proven to be helpful to polish the surface.

Before the thin coating is applied, the electrodes are particularly preferably polished until they have a mirror finish since, in this way, a uniformly controlled application of the thin coating of high electrical conductivity can be achieved.

A method for producing an anode for use in the coating system, in particular for carrying out PVD processes, is therefore characterized in that at least the electrode provided as the anode goes through the process steps "polishing" and "coating" prior to the application of the thin coating. The electrode is polished until the value of the mean roughness of the polished surface preferably reaches a value between 0.1 μm and 0.3 μm and particularly preferably a value between 0.01 μm and 0.1 μm. With subsequent polishing, the application of the thin coating takes place, and the thin coating is also polished after its application until the roughness of the polished thin coating surface reaches a value between 0.01 μm and less than 0.1 μm.

After completion of the polishing process, typical roughness values of the mean roughness value of the polished surface of the thin coating of Ra<0.1 μm or a roughness depth of Rz<0.7 μm are measured using roughness measuring devices. In the case of a lapped surface, the typical roughness values of the mean roughness value Ra<0.01 μm or a roughness depth Rz<0.07 μm are measured using tactile roughness measuring devices after the lapping process has been completed. In addition to the tactile roughness measuring devices, optical devices such as laser microscopes can be used.

The process steps "polishing" and "coating" are preferably carried out a plurality of times. The process steps "polishing" and "coating" can either not be repeated at all or in any order after they have been carried out at least once.

The invention is described below in a plurality of embodiments and illustrated in the associated figures.

FIG. 1 is a schematic illustration that shows, as a first embodiment, the cross section of an anode (614) coated with an adhesion-reducing thin coating of high electrical conductivity. The adhesion-reducing thin coating of high electrical conductivity is, in this case, partially applied to the core material of the anode (601) with a preferred coating thickness of 0.1 μm to 3.5 μm (624). In this example, the anode is not coated in the region where the anode is fitted into an electrode mount with a blind hole-shaped recess (604).

Figure 2:
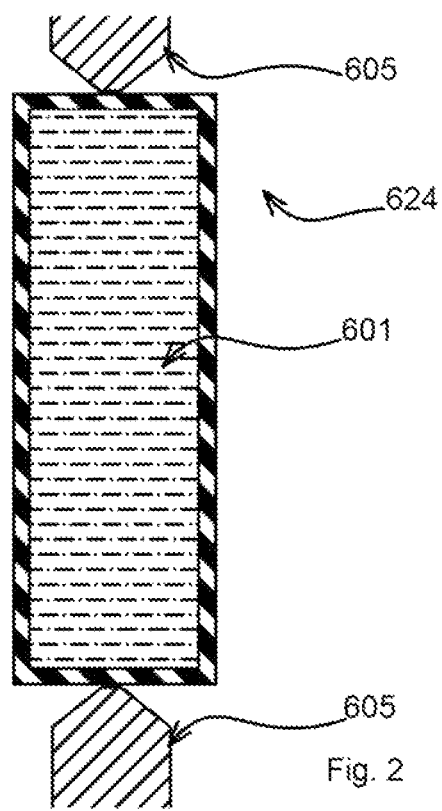

FIG. 2 is a schematic illustration that shows, as a second embodiment, the cross section of an anode (614) completely coated with an adhesion-reducing thin coating of high electrical conductivity, which, for example, is mounted at the end (605) and is electrically connected in a conductive manner.

In one embodiment, a graphite cathode and an anode are arranged in a vacuum chamber provided with a sensor system for monitoring the process conditions and a pumping station.

The vacuum chamber is additionally provided with an opening which can be closed in a gas-tight, in particular vacuum-tight, manner. In the interior of the vacuum chamber there is a mount for the application of the substrates intended for coating. The mount itself is configured to be electrically insulating with respect to the process chamber wall and electrically insulating with respect to the substrate. The substrates are connected as auxiliary anodes after they have made electrical contact over the course of the process.

Beforehand, with the opening of the vacuum chamber wall sealed in a gas-tight manner, the process pressure in the vacuum chamber is set to approx. $10^{-6}$ hPa by means of the connected pumping station. An electrical voltage of approx. 200 V is set between the main electrodes.

The laser of the ignition device generates a beam spot of pulsed laser light on the surface of the graphite cathode over a period of approximately 50 ns. This generates carbon ions and electrons, and the electric arc ignites for a period of approx. 330 μs. After this time has elapsed, a new pulse of the beam spot is generated from laser light at a location that is not identical to the previous location. Using this procedure, the entire cathode surface is scanned.

The anode used is coated with an adhesion-reducing and electrically conductive nitride coating of TiN. The coating thickness of the coating used is approx. 2 μm.

In order to apply the thin coating of high electrical conductivity to the anode surface, said surface is mechanically polished beforehand. The mechanical polishing or lapping of the anode surface is carried out according to the following steps until the mirror finish is achieved:

1. preparation of the uncoated anode by sanding said anode with an abrasive having a grain size between 80-120,
2. removal of rough scratches by sanding with a "medium" grain size 180-220,
3. pre-polishing with a polishing disc having a grain size of 280-320 and
4. polishing with a suitable polishing paste and a suitable polishing disc.

The grain sizes of the above-mentioned polishing and abrasive materials refer to the classification according to the FEPA standard.

LIST OF REFERENCE SIGNS

601 Anode
604 Electrode mount as a blind hole-shaped recess
605 Electrode mount as a front mount
614 Partly coated anode

The invention claimed is:

1. An anode, suitable for use in a physical vapor deposition process, wherein a surface of the anode is completely or partially covered with an adhesion-reducing thin coating that is electrically conductive, wherein the adhesion-reducing thin coating has a thickness of between 0.1 μm and 3.5 μm, wherein the thin adhesion-reducing coating is a ceramic nitride coating.

2. A device suitable for physical vapor deposition processing with an anode arrangement, the device comprising:
    a vessel capable of maintaining different process pressures within an interior of the vessel, wherein at least two electrodes are arranged in the interior of the vessel, wherein the at least two electrodes are subjectable to an electrical voltage from outside the vessel, wherein at least one of the electrodes is configured as an anode and at least one of the electrodes is configured as a cathode, wherein the anode and cathode are capable of generating an arc discharge between the cathode and the anode over a defined period of time, wherein the anode comprises an adhesion-reducing thin coating that is electrically conductive and completely or partially covers the surface of the electrode, wherein the adhesion-reducing thin coating has a thickness of between 0.1 μm and 3.5 μm.

3. The anode according to claim 1, wherein the anode comprises a hot anode that may be heated to a predefined temperature.

4. The anode according to claim 1, a material of the ceramic nitride coating is a metal nitride selected from the metals Ti, Zr, Hf and V or a mixture of these.

5. The anode according to claim 4, wherein the selected metal nitride has a specific electrical resistance of between 10μΩ·cm and 150μΩ·cm.

6. The device according to claim 2, wherein the cathode consists entirely of an electrically conductive carbon modification or comprises an electrically conductive carbon modification at least partially on its surface.

7. The device according to claim 6, wherein the electrically conductive carbon modification is graphite.

8. The device according to claim 2, wherein a distance between the electrodes is adjustable with at least one of the electrodes being designed to be movable.

9. The device according to claim 2, wherein at least one of the electrodes is configured to be exchangeable.

10. The device according to claim 2, wherein the device is usable as a coating installation for coating substrates applied to a mount.

11. A method for producing an anode suitable for arc physical vapor deposition (APVD) processing, the method comprising:

polishing a surface of an electrode of the anode until the value of an average roughness of the polished surface reaches between 0.01 μm and 0.3 μm;

applying, after the polishing, a thin coating that completely or partially covers the polished surface, wherein the thin coating is an adhesion-reducing thin coating that is electrically conductive; and polishing or leaving as-is the thin coating until an average roughness of the polished and thin-coated surface reaches a value of greater than 0.01 μΩ·m and less than 0.1 μΩ·m.

12. The method according to claim 11, wherein the polishing the surface of the electrode and the applying the thin coating are carried out a plurality of times.

13. The method according to claim 12, wherein the polishing the surface of the electrode and the applying the thin coating are repeated in any order after having been carried out once.

* * * * *